United States Patent
Walz et al.

(10) Patent No.: US 6,363,217 B1
(45) Date of Patent: Mar. 26, 2002

(54) CONVECTIVE HEATER EMPLOYING FOAM METAL DIFFUSER

(75) Inventors: Mark J. Walz, Northborough; Jeffrey Ackerman, Middleton, both of MA (US)

(73) Assignee: GenRad, Inc., Westford, MA (US)

( * ) Notice: Subject to any disclaimer, the term of this patent is extended or adjusted under 35 U.S.C. 154(b) by 0 days.

(21) Appl. No.: 09/775,923

(22) Filed: Feb. 2, 2001

(51) Int. Cl.[7] .................................................. F24H 1/10
(52) U.S. Cl. ...................................................... 392/485
(58) Field of Search ................................. 392/485, 379; 219/521, 530; 228/180.1, 180.21, 264

(56) References Cited

U.S. PATENT DOCUMENTS

| | | | | |
|---|---|---|---|---|
| 4,675,509 A | * | 6/1987 | Hell | 219/486 |
| 4,775,775 A | * | 10/1988 | Spigarelli et al. | 219/382 |
| 4,775,776 A | * | 10/1988 | Rahn et al. | 219/388 |
| 5,228,614 A | * | 7/1993 | Elliott et al. | 228/37 |
| 6,123,250 A | * | 9/2000 | De Klein et al. | 228/180.1 |
| 6,168,065 B1 | * | 1/2001 | Willemen | 228/9 |

* cited by examiner

Primary Examiner—Tu Ba Hoang
Assistant Examiner—Vinod D. Patel
(74) Attorney, Agent, or Firm—Edwin H. Paul, Esq.

(57) ABSTRACT

A heater box for PCB boards uses open cell metal foam as a heat sink and diffuser of heated gas. The heated gas is dispensed through a metal fabric mesh and then to the PCB to be heated. The gas is introduced under pressure and flow regulated to conduits in the metal foam diffuser. The conduits have side holes that allow the gas to diffuse evenly through the foam. The gas is heated by electrical resistance heaters built into the conduits or by a resistance heated layer between the conduits and the foam. The frame that holds the PCB to be heated and the metal fabric mesh and the heater box itself are all laterally floating with respect to each other.

11 Claims, 6 Drawing Sheets

CONVECTIVE HEATER EMPLOYING FOAM METAL DIFFUSER

BACKGROUND OF THE INVENTION

1. Field of the Invention

The present invention relates ton heating printed circuit boards, and more particularly to convection heating such printed circuit boards uniformly and quickly.

2. Background Information

Large printed circuit boards (PCBs) have multiple layers where some layers bear narrow etched conductive runs and other layers might have large ground and/or power planes. Such PCBs and methods for mounting the components and soldering the boards are well known in the art and only a brief review is present herein. The conductive runs on the layers are interconnected by plated through holes, called vias, which traverse the thickness of the PCB making the designed electrical connections between the various layers. Usually one external side only has etched runs while the opposite external side is bears components, although it is known to have components on both sides. The electrical connections through the populated board are soldered, typically, on a wave solder machine or by re-flow techniques. Such techniques are well known in the art. But, when such boards are large and carry a wide assortment of components they are difficult to solder reliably. Later it is difficult to rework defective solder joints on such boards. Part of the problem of soldering and/or re-soldering such boards stems from temperature differentials on the board that stress the etched runs and vias causing small cracks or even full breaks. Such cracks and/or breaks produce defective boards. The problem is insidious when cracks occur in etched runs that may not be detected at inspection, because such cracks will often cause field failures that are expensive to repair and, even more importantly, which customers experience, thereby damaging the product and its maker's reputation.

Maintaining even temperatures over the extended area of these large PCBs is difficult, and is made more difficult by the uneven mass distribution of board mounted components and large areas of plated ground planes. These differences cause differing final temperatures in areas of the board and different times to stabilize at a temperature. But, temperature differentials and the resulting thermal stress must be minimized to preserve the integrity, reliability and long life of such PCB assemblies.

Practitioners in the field have used infrared heat sources, conduction and convection methods for heating PCBs. Convection using a gas is attractive since a large amount of heat energy can be quickly applied to a PCB, but a lingering problem is the inability to maintain a uniform distribution of the heat over a large area resulting in unacceptable temperature differentials across the PCBs.

The present invention is directed towards a gas convection system for uniformly heating PCBs.

SUMMARY OF THE INVENTION

The present invention addresses the above limitations and problems of the prior art techniques. In the present invention a circuit board heater provides a surface face at least as large as a PCB being heated. The surface face is constructed and arranged to emit a heated gas. The non-populated (no components) flat etched side (the component side could also be heated) of the PCB is presented in close proximity to the surface whereby the PCB is heated.

The heat emitting surface face is preferably a surface of open-cell metal foam. Heated gas is introduced into the metal foam and is forced through the foam, diffusing uniformly to the surface face and therefrom to the PCB. In another embodiment, a woven fine mesh metal fabric overlays the heat emitting surface face. This fabric acts as a final gas diffuser and blender in addition to providing additional backpressure to the gas flow. This backpressure aids the uniformity of the emitting gas, as is well known in the field.

In one preferred embodiment, an electric current carrying heating screen is placed between insulating layers of ceramic foam that allow gas to pass through. The screen is porous to gas and preferably covers and provides uniform heating over the entire face opposite the surface face adjacent to the PCB. Gas is introduced through the screen and is heated thereby, and thereafter travels through the foam diffuser to the heat emitting face.

In another embodiment, a gas is fed into one or many conduits that run throughout the metal foam. Each conduit has a plurality of gas outlets. The gas is forced into the conduits and exits the gas outlets of the conduit into an open cell metal foam gas diffuser. The diffuser accepts the heated gas and transports that gas to the heated gas emitting surface face, through a mesh metal fabric, and therefrom to the PCB. The gas may be heated before entering the conduit in a preferred embodiment, or preferably the inner surface of the conduit is heated by an external power source and the gas is heated while travelling along the conduit. In a preferred embodiment the conduit itself carries an electric current and the electrical resistance of the conduit is designed along with the magnitude of the current to heat the inner surface of the conduits to a designed temperature. The gas coming into contact with the inner surfaces is heated.

In another preferred embodiment the conduits may be designed to achieve a temperature gradient along the conduits and the gas emitting openings in the conduits may be of differing sizes and spacings to allow uniform dispersion of the heated gas.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
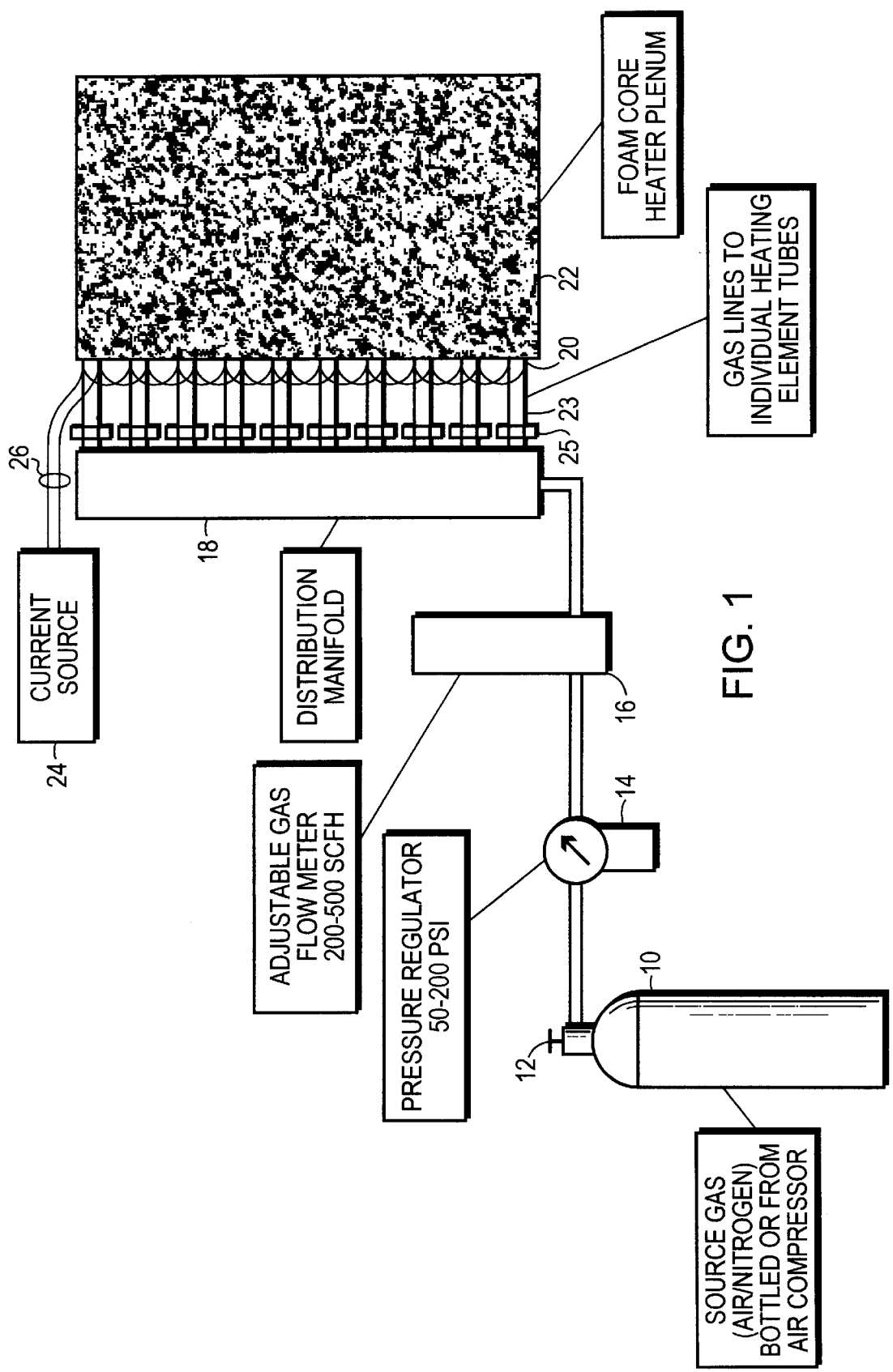
FIG. 1 is a system block diagram of an embodiment of the invention.

FIG. 1 includes a gas supply 10 from a pressurized container. Preferably the gas is an air nitrogen mixture, but other gases and mixtures may be used. The valve 12 when opened allows gas to flow through a pressure regulator 14 set between 50 and 200 psi (pounds per square inch) and an adjustable (from 200 to 500 cubic feet per hour) flow meter 14 to a distribution manifold 18. The manifold 18 provides equal gas flow out through a plurality of eighth inch internal diameter plastic tubes 23 with orifice restrictors 25 to conduits 20 through a metal foam heater core 22. The brass orifice restrictors 25 have preferably an internal diameter of 0.088 to 0.092 inches. These restrictors add backpressure to the manifold and thereby provide a more uniform gas flow through the gas lines 23. An electrical current source or power supply 24 provides current to heater elements in each of the conduits in parallel via an electrical cable 26, which is jumpered to each conduit.

Figure 2A:
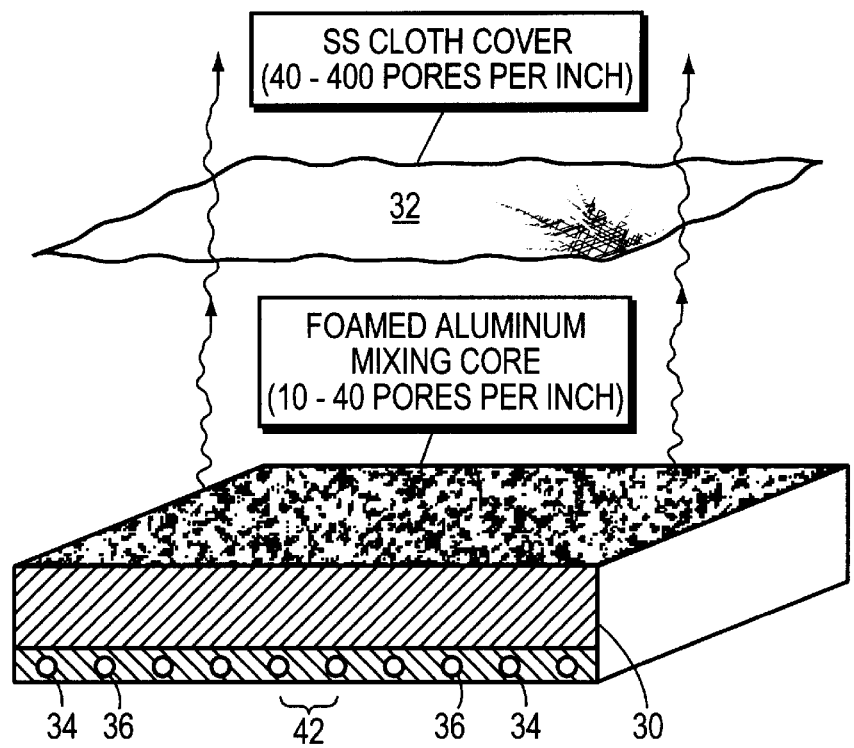
FIG. 2A is a view of the heater core.

FIG. 2A shows the foam aluminum gas diffusing heater core. The foam 30 is one inch thick by fourteen inches by sixteen inches of machined aluminum foam. The foam pore densities are between ten and forty pores per inch (PPI). The metal fabric mesh 32 is of 304 stainless steel with pore densities from forty to four hundred PPI. With PPI of forty the open area percentage of the mesh fabric is about 31.4%, and with a PPI of four hundred the percentage is about 36%. The foam is about 3 to 12% of solid metal aluminum density, of course the aluminum provides high thermal conductivity.

FIG. 2A shows ten conduits 34 that run through the lower portion of the foam core. These conduits run the entire length of the core and each conduit has lateral holes 36 on—both sides of the conduits running the length of the conduit. The gas enters each conduit 34 and escaped through the holes 36. The gas then travels up through the diffusing foam and through the mesh fabric to a PCB to be heated.

Figure 2B:
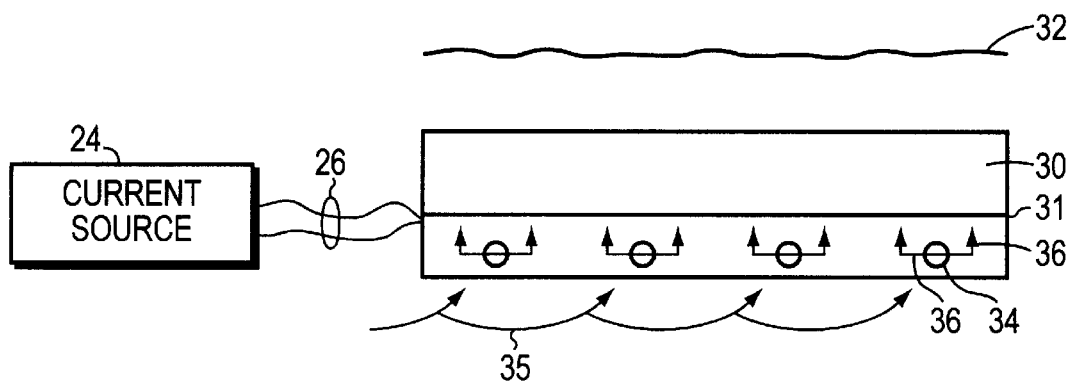
FIG. 2B is an alternative arrangement.

FIG. 2B shows an alternative design where there is a heater blanket 31 disposed between the conduits 34 and the main part of the foam 30. The blanket is heated by an external power source 24 with the current carried to the heater via the cable 26. The unheated gas escapes through the side holes 36 in the conduits, it is heated by the blanket 31 and continues upward through the foam 30 and the metal fabric mesh 32 to the PCB to be heated.

Figure 3:
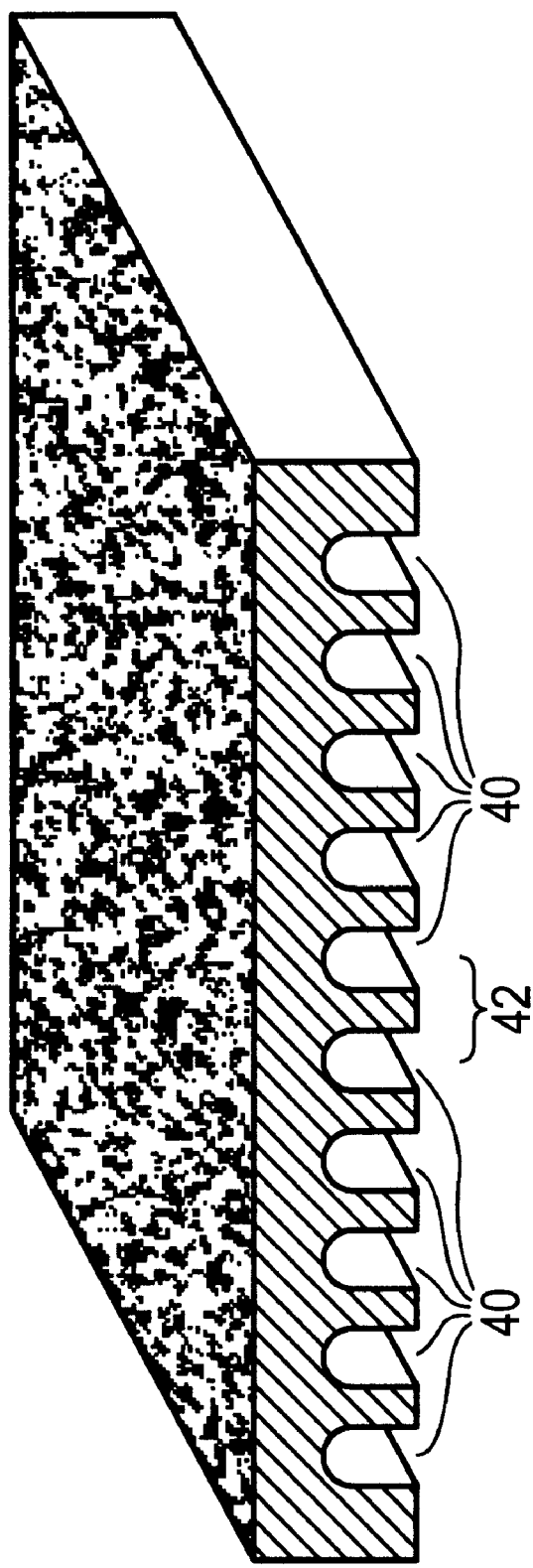
FIG. 3 is a pictorial view of the metal foam.
Figure 4:
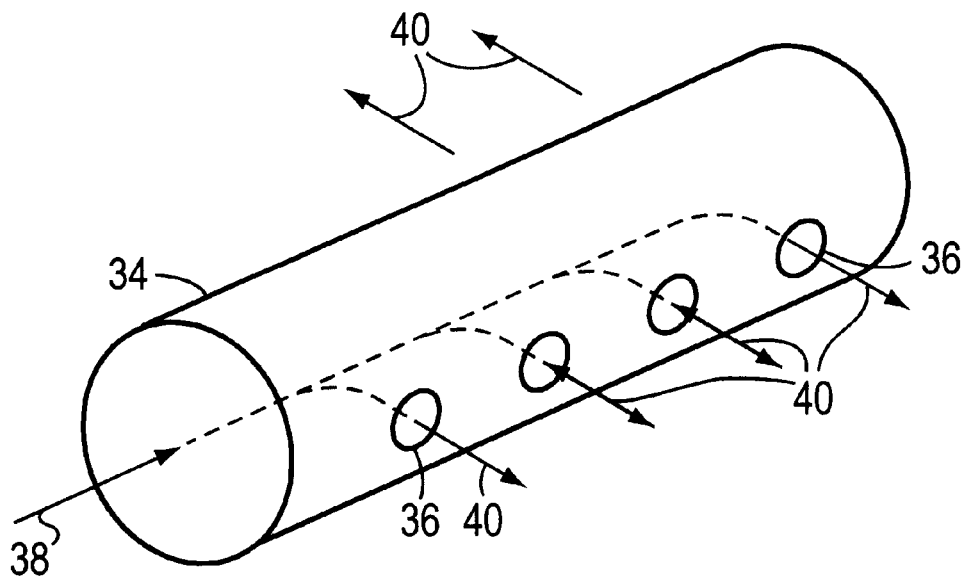
FIG. 4 is a perspective drawing of a conduit.
Figure 5:
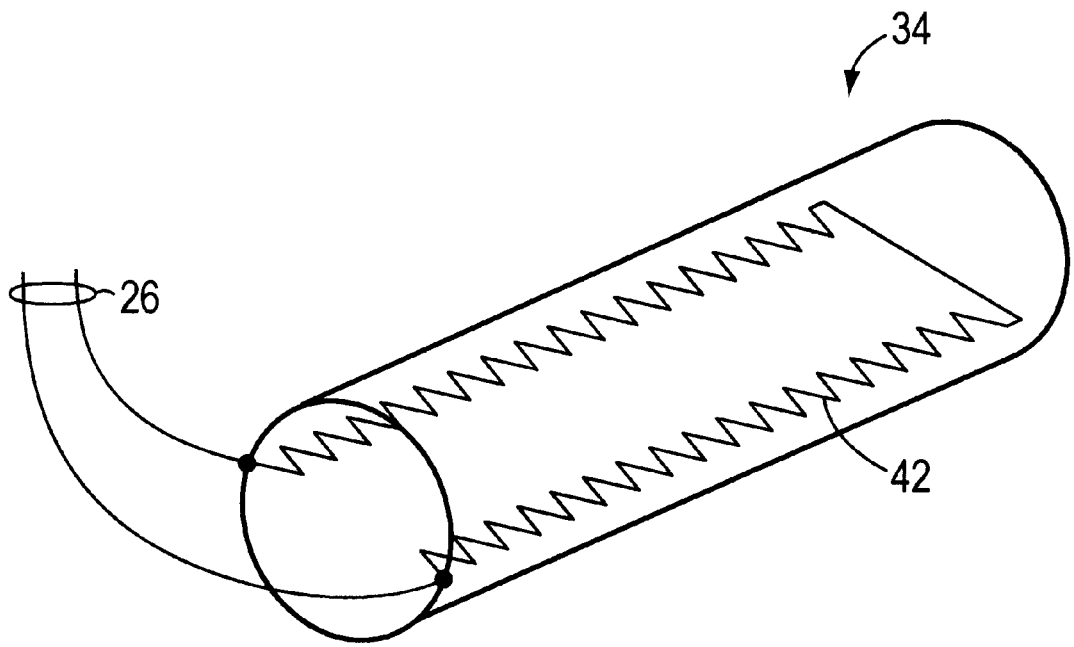
FIG. 5 is a schematic drawing of the heater element in a conduit.

FIG. 3 shows a perspective drawing of the aluminum foam itself 36 with ten tunnels 40 that accept the conduits 36. FIG. 4 represents a conduit 34 showing the gas entering 38 and escaping 40 through the lateral holes 36 which are arranged on both sides of the conduit 34. FIG. 5 shows an electrical heating element connected to the electric cable 26 in side a conduit 34. There is a resistive element 42 arranged on the inner surface of the conduits. This element heats up when current is driven therethrough and heats the gas as the gas travels along the conduit. In this embodiment the heater output was out about 400 Watts, 1.9 amps at 208 volts, and used 75–80 SCFH (Standard Cubic Feet per Hour) air flow. In another preferred embodiment, the heaters are rated at about 500 Watts each, and in yet another embodiment the center two conduits 42 (FIG. 2A and 3) are not used. The heater element is electrically insulated from the metal foam and conduit. In another preferred embodiment, the heater element may be fabricated within the conduit walls or the conduit wall itself may be formed to provide the heater element. As is known in the art, the heater element must be electrically insulated from other electrical conductors.

Use of electrical heaters allows, in preferred embodiments, for the designer to tailor the heating elements to match the board and/or the environment. The wattage of the heating elements can be different in different parts of the foam core, and the heater elements themselves may be non-linear so that equal sections of the same heater element can emit different amounts of heat. In this way the designed can adjust for cold and hot spots that may occur, especially on large boards with very disparate heat loads. The temperature of different parts of a sample board may be measured by thermocouples or other such temperature detectors as are known in the art.

Figure 6:
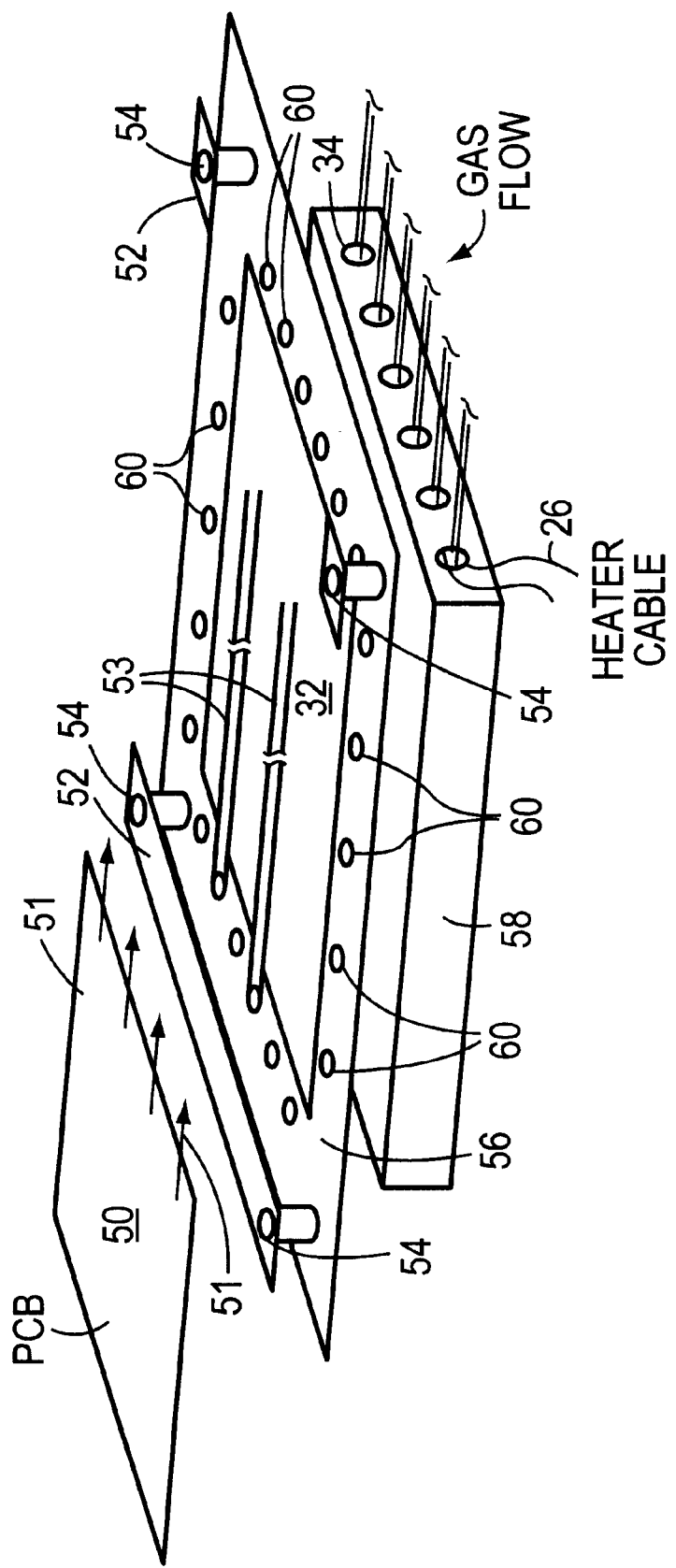
FIG. 6 is a perspective composite drawing of an embodiment of the invention.

FIG. 6 is a perspective view of a PCB heater assembly that is described in more detail with reference to the following FIGS. Basically, the PCB to be heated 50 moves in the directions of the arrows 51 and placed over the metal fabric mesh 32. The PCB is supported by rods 53 connected to the frame 52. Corner screws 54 extend through oversized holes in the frame and support the cover 56. The cover supports the heater box 58 by shoulder screws arranged around the periphery of the fabric mesh 32. The open area above the mesh 32 is about 14 inches by 16 inches, although other dimensions can be used. Gas flows into the conduits 34 that are heated via the cable 26. The heated gas is then distributed, as discussed before, via side holes in the conduits into the metal foam.

Figure 7:
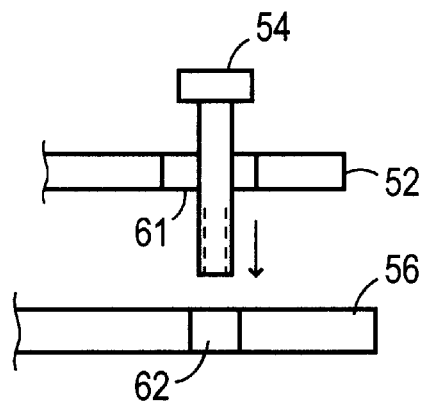
FIG. 7 show is a sectioned drawing of a corner bolt assembly.
Figure 8:
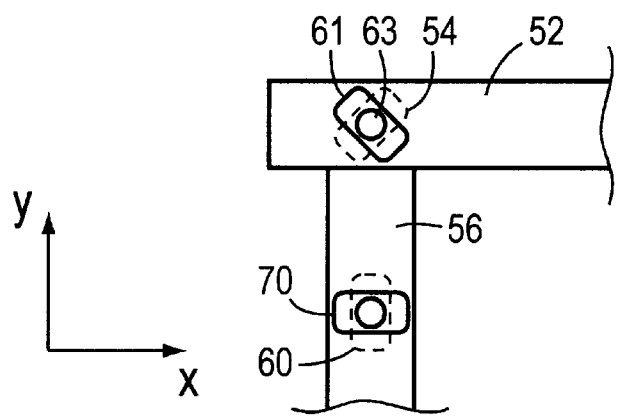
FIG. 8 is top view of a corner of a heater assembly.

FIG. 7 shows the detail of the corner screw 54 that extends through the frame 52 via oversized holes 61. The screws 54 are threaded and mate with the threaded holes 62 in the cover 56. These corner screws are in tension from the weight of the cover and heater box that is supported from the cover. FIG. 8 shows the corner screw 54 and the oversized hole 61. The shaft of the corner screw 63 does not engage the frame but is free Is to move in both the x and y directions as the cover heats up.

Figure 9:
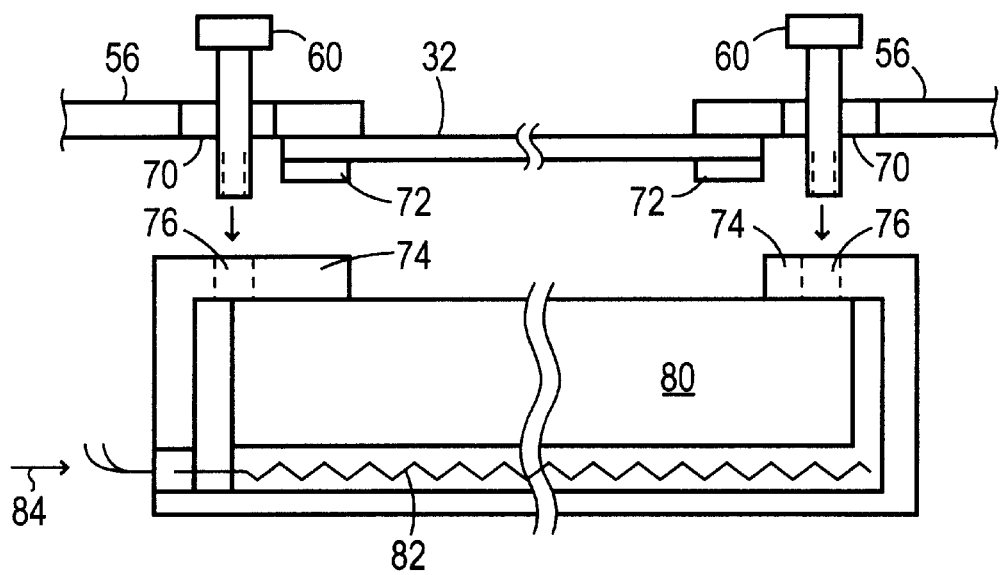
FIG. 9 is a sectioned view of the heater box and cover.

FIG. 9 shows a detail of the cover and the heater box assembly. The shoulder screws 60 extend through oversized, slotted holes 70 in the cover 56. The oversized holes allow the heater box to expand thermally wherein the shoulder screws 60 move in the x and y directions without putting any lateral forces on the cover itself.

The fabric metal mesh 32 is spot welded to the under side of the cover. A gasket insulating material 72 (Fiberfax® made by Carborundum) is placed between the fabric mesh 32 and the lip 74 of the heater box. The shoulder screws 60 are threaded and attached to threaded holes 76 along the periphery of the heater box. However, other gasket materials of a tape or blanket material made from alumina-silica fibers, calcium-silica fibers, alumina fibers, mineral wool or rock fibers can be used to advantage in the present invention.

The open cell metal foam 80 fills the box. As discussed above, the bottom of the foam has ten channels for conduits that will carry a gas. The gas is introduced under pressure 84 into the conduits. There are heater elements 82 along the length of each conduit and side holes as discussed above that allow the heated gas to escape and travel upwardly through the foam and the mesh to the PCB.

The open cell aluminum foam, being highly thermally conductive, acts to improve temperature uniformity by conducting heat away from hot spots and accelerating heating of cold spots. As the foam mass saturates with thermal energy, the thermally conductive foam acts as both a heat sink and radiator. This characteristic acts to distribute heat uniformly and quickly in order to minimize temperature gradients and therefore more uniformly transfers heat to the distributed air flow.

As discussed above, the frame supports the cover and metal fabric mesh vertically only. The cover and mesh may move laterally without stressing the frame. The cover also moves "floats" with respect to the heater box in the lateral directions but supports the heater box vertically. The construction allows the heated gas to pass through the fabric mesh while allowing thermal expansion of the heater box, and the thermal expansion of the cover and metal fabric mesh to be isolated laterally from each other and both isolated laterally from the frame supporting the PCB being heated. This prevents thermal distortion of the assemblies that would have negatively affected the uniform distribution of the heated gas and the resulting temperature uniformity of the PCB.

What is claimed is:

1. A circuit-board heater comprising:
   a circuit-board support sized and shaped to support a printed-circuit board thereon;
   a gas source;
   a supply conduit including a conduit outlet and including a conduit inlet in such fluid communication with the gas source as to receive a gas flow therefrom;
   a heat source in such thermal communication with the interior of the supply conduit as to heat gas flowing therein and thereby result in heated-gas flow from the conduit outlet; and
   a diffuser consisting essentially of an open-cell metal foam, forming an outlet face, and being so interposed between the conduit outlet and the circuit-board support that, when the circuit-board support is supporting a printed-circuit board, gas from the conduit outlet passes through the diffuser and issues from the outlet face toward the printed-circuit board.

2. The circuit-board heater as defined in claim 1 wherein the open cell metal foam has pore densities of from about ten to about forty pores per inch.

3. The circuit-board heater as defined in claim 1 further comprising a metal mesh fabric, placed over the outlet face between the foam core and the printed circuit board.

4. The circuit-board heater as defined in claim 3 wherein the metal mesh fabric has pore densities of about forty to more than about four hundred pores per inch.

5. The circuit board heater as defined in claim 1 wherein the heat source comprises electrical resistance elements distributed along the inner surface of the conduits.

6. The circuit board heater as defined in claim 1 wherein the heat source comprises a heater layer within distributed between the conduit outlet and the diffuser face wherein the gas is heated by the heater layer before exiting the diffuser face.

7. The circuit board heater as defined in claim 1 further comprising means to measure the resulting temperature differentials across the printed circuit board being heated, and wherein the heat source is arranged and constructed such that the temperature differentials are reduced.

8. The circuit board heater as defined in claim 1, wherein the diffuser is substantially supported vertically from the circuit board support, but where the diffuser is substantially floating laterally with respect to the circuit board support.

9. A circuit-board heater comprising:
   a circuit-board support sized and shaped to support a printed-circuit board thereon;
   a gas source;
   a supply conduit including a conduit outlet and including a conduit inlet in such fluid communication with the gas source as to receive a gas flow therefrom;
   a heat source in such thermal communication with the interior of the supply conduit as to heat gas flowing therein and thereby result in heated-gas flow from the conduit outlet;
   a diffuser and heat sink consisting essentially of an open-cell metal foam, forming an outlet face, and being so interposed between the conduit outlet and the circuit-board support that, when the circuit-board support is supporting a printed-circuit board, gas from the conduit outlet passes through the diffuser and issues from the outlet face toward the printed-circuit board, and
   a metal fabric mesh positioned between the circuit board support and the diffuser, wherein the metal fabric mesh accepts the gas from the outlet face and passes the gas to the printed circuit board.

10. The circuit board heater as defined in claim 9, further comprising:
    a cover fixed to the peripheral edges of the metal fabric mesh and supporting the metal fabric mesh;
    a box containing the diffuser;
    a gasket arranged between the cover and the top of the box, the gasket surrounding the periphery of the metal fabric mesh, wherein the gasket provides a gas seal;
    means for supporting the cover from the circuit board support, but where the cover is substantially floating laterally with respect to the circuit board support; and
    means for supporting the heater box from the cover, but wherein the heater box is substantially floating laterally with respect to the cover and hence floating with respect to the support.

11. The circuit-board heater as defined in claim 9 wherein the wherein the open cell metal foam has pore densities of from about ten to about forty pores per inch and wherein the metal mesh fabric has pore densities of about forty to about four hundred pores per inch.

* * * * *